(12) United States Patent
Okayasu et al.

(10) Patent No.: US 12,166,430 B2
(45) Date of Patent: Dec. 10, 2024

(54) ELECTRIC POWER CONVERSION APPARATUS AND ELECTRIC POWER CONVERSION SYSTEM

(71) Applicant: TMEIC Corporation, Chuo-ku (JP)

(72) Inventors: Masakazu Okayasu, Tokyo (JP); Issei Fukasawa, Tokyo (JP); Masahiro Kinoshita, Tokyo (JP)

(73) Assignee: TMEIC Corporation, Chuo-ku (JP)

( * ) Notice: Subject to any disclaimer, the term of this patent is extended or adjusted under 35 U.S.C. 154(b) by 141 days.

(21) Appl. No.: 17/996,389

(22) PCT Filed: Apr. 27, 2020

(86) PCT No.: PCT/JP2020/018038
§ 371 (c)(1),
(2) Date: Oct. 17, 2022

(87) PCT Pub. No.: WO2021/220374
PCT Pub. Date: Nov. 4, 2021

(65) Prior Publication Data
US 2023/0216429 A1    Jul. 6, 2023

(51) Int. Cl.
*H02M 7/53* (2006.01)
*G01R 31/52* (2020.01)
*H02M 7/5387* (2007.01)

(52) U.S. Cl.
CPC ......... *H02M 7/5387* (2013.01); *G01R 31/52* (2020.01)

(58) Field of Classification Search
CPC ................................ H02M 7/5387; G01R 31/52
See application file for complete search history.

(56) References Cited

U.S. PATENT DOCUMENTS 9,013,063 B2 * 4/2015 Sato .................. H02J 9/062
307/64
2007/0194724 A1 8/2007 Ishii et al.
(Continued)

FOREIGN PATENT DOCUMENTS

DE  10 2019 002 713 A1  10/2019
JP  2019-92333 A  6/2019

OTHER PUBLICATIONS

International Search Report (with English Translation) and Written Opinion issued Aug. 4, 2020 in PCT/JP2020/018038 filed on Apr. 27, 2020, 10 pages.

(Continued)

*Primary Examiner* — Rafael O De Leon Domenech
(74) *Attorney, Agent, or Firm* — Oblon, McClelland, Maier & Neustadt, L.L.P.

(57) ABSTRACT

An electric power conversion apparatus includes: an electric power conversion circuit that allows a DC terminal to be connected to a DC power source via a DC bus line, and performs at least one of converting DC power of the DC power source into AC power to output, or converting AC power into DC power to output; a DC switch turned on when the electric power conversion circuit performs electric power conversion; an AC switch provided on a side of the AC terminal, and turned on when the electric power conversion circuit performs the electric power conversion; a DC voltmeter that measures a potential at a predetermined portion, on a side of the DC terminal; a ground connection portion that connects the DC bus line and ground potential; and a control circuit connected to the electric power conversion circuit, the DC switch, the AC switch, and the DC voltmeter.

7 Claims, 17 Drawing Sheets

(56) References Cited

U.S. PATENT DOCUMENTS

| | | | | |
|---|---|---|---|---|
| 2009/0190275 A1* | 7/2009 | Gilmore | ................ | H02H 3/335 |
| | | | | 361/42 |
| 2012/0163048 A1* | 6/2012 | Victor | ..................... | H02H 3/16 |
| | | | | 363/55 |
| 2012/0217809 A1* | 8/2012 | Sato | ...................... | H02J 9/062 |
| | | | | 307/64 |
| 2018/0045767 A1* | 2/2018 | Daigle | .................. | G01R 35/00 |
| 2019/0074695 A1* | 3/2019 | Motsenbocker | ........ | F24H 1/185 |
| 2020/0083715 A1* | 3/2020 | Yoscovich | .............. | H02J 3/381 |

OTHER PUBLICATIONS

Indian Office Action issued May 13, 2024 in Indian Patent Application No. 202217056974, 7 pages.

\* cited by examiner

ELECTRIC POWER CONVERSION APPARATUS AND ELECTRIC POWER CONVERSION SYSTEM

FIELD

The present disclosure relates to an electric power conversion apparatus and an electric power conversion system.

BACKGROUND

Conventionally, as described in paragraph [0004] of JP 2019-92333 A, for example, there is known a problem that a DC ground fault occurs in an electric power conversion apparatus which is connected to a public utility supply system or the like. The electric power conversion apparatus according to the publication is improved so that the electric power conversion apparatus can continue the operation even if an accident such as a ground fault has occurred in the system, by using a carrier signal in which a phase shift amount is devised.

CITATION LIST

Patent Literature

[PTL 1] JP 2019-92333 A

SUMMARY

Technical Problem

In the above conventional technology, when the ground fault has occurred, the electric power conversion apparatus is continuously operated by changing a content of the control. On the other hand, there is a case where it is desired to identify an abnormal electric power conversion apparatus in which a DC ground fault has occurred and disconnect the abnormal electric power conversion apparatus from an electric power conversion system. This is because normal electric power conversion can be continued by a normal electric power conversion apparatus in which the DC ground fault is not occurring. There is a possibility that the DC ground fault occurs in each of a plurality of electric power conversion apparatuses which are connected in parallel. It is required to accurately identify the electric power conversion apparatus in which the DC ground fault has occurred.

There is an electric power conversion system in which a plurality of electric power conversion apparatuses are connected in parallel. Among these, there is an electric power conversion system in which a plurality of electric power conversion apparatuses are connected in parallel, without being connected via a transformer (in other words, without insulation). In this electric power conversion system, a local potential change due to the DC ground fault which has occurred in one electric power conversion apparatus is transmitted to another electric power conversion apparatus via a parallel connection point. Because the local influence of the DC ground fault is transmitted to the entire system, it becomes difficult to identify a location at which the DC ground fault has occurred.

Such a technology is known as to monitor the entire electric power conversion system by using a higher-level control apparatus. For example, such a method can be considered as to identify the location at which the DC ground fault has occurred, by utilizing this higher-level control apparatus. However, this method cannot be implemented in an electric power conversion system which does not have the higher-level control apparatus. Furthermore, there is also the complexity of mounting dedicated control processing on the higher-level control apparatus, constructing a communication function with each of the electric power conversion apparatuses, and the like. Then, the inventors of the present application have made earnest studies, and as a result, have reached a novel technology in which each of the electric power conversion apparatuses can diagnose whether or not the DC ground fault has occurred on the side of its own DC terminal.

The present disclosure has been made to solve the problems as described above, and is directed at providing an electric power conversion apparatus which can diagnose whether or not the DC ground fault occurs on the side of its own DC terminal, when a plurality of electric power conversion apparatuses are connected in parallel via a parallel connection point.

Solution to Problem

A first electric power conversion apparatus according to the present disclosure includes:
  an electric power conversion circuit that includes a DC terminal and an AC terminal, allows the DC terminal to be connected to a DC power source via a DC bus line, and performs at least any one of converting DC power of the DC power source into AC power and outputting the AC power from the AC terminal, and converting AC power into DC power and outputting the DC power from the DC terminal;
  a DC switch that is provided between the DC power source and the electric power conversion circuit, and is turned on when the electric power conversion circuit performs electric power conversion;
  an AC switch that is provided on a side of the AC terminal, and is turned on when the electric power conversion circuit performs the electric power conversion;
  a DC voltmeter that measures a potential at a predetermined portion which has been determined beforehand on a side of the DC terminal;
  a ground connection portion that connects the DC bus line and a ground potential; and
  a control circuit that is connected to the electric power conversion circuit, the DC switch, the AC switch and the DC voltmeter, wherein
  the control circuit is structured so as to
  detect whether or not a DC ground fault voltage has been generated on the basis of a measurement value of the DC voltmeter, while the electric power conversion circuit performs the electric power conversion;
  when the DC ground fault voltage has been generated, execute AC-side opening control of opening the AC switch in a state in which the DC switch is turned on,
  when the DC ground fault voltage has been restored in response to the AC-side opening control, determine that the DC ground fault is not occurring on a side of the DC terminal, and
  when the DC ground fault voltage is not restored in response to the AC-side opening control, determine that the DC ground fault has occurred on the side of the DC terminal.

A second electric power conversion apparatus according to the present disclosure includes:
  an electric power conversion circuit that includes a DC terminal and an AC terminal, allows the DC terminal to be connected to a DC power source via a DC bus line, converts DC power of the DC power source into AC power, and outputs the AC power from the AC terminal;

a DC switch that is provided between the DC power source and the electric power conversion circuit, and is turned on when the electric power conversion circuit performs electric power conversion;

a DC voltmeter that is provided on a side closer to the DC power source than the DC switch;

a ground connection portion that connects the DC bus line and a ground potential on a side closer to the DC power source than the DC switch; and a control circuit that is connected to the electric power conversion circuit, the DC switch and the DC voltmeter, wherein the control circuit is structured so as to detect whether or not a DC ground fault voltage has been generated on the basis of a measurement value of the DC voltmeter, while the electric power conversion circuit performs the electric power conversion;

when the DC ground fault voltage has been generated, execute DC-side opening control of opening the DC switch, when the DC ground fault voltage has been restored in response to the DC-side opening control, determine that the DC ground fault is not occurring on a side closer to the DC power source than the DC switch, and when the DC ground fault voltage is not restored in response to the DC-side opening control, determine that the DC ground fault has occurred on a side closer to the DC power source than the DC switch.

Advantageous Effects of Invention

According to the present disclosure, a diagnostic function is provided which is effective for the DC ground fault, in a case where an electric power conversion system is constructed in which a plurality of the first electric power conversion apparatuses are connected to a parallel connection point without being connected via a transformer. This diagnostic function is realized by using the AC-side opening control. The function can diagnose whether or not the DC ground fault voltage is generated by utilizing a mechanism in which the AC-side opening control acts on voltage on a side of the DC terminal. By observing a change in the DC voltage accompanying the AC-side opening control, it is possible to discriminate whether the DC ground fault has occurred on a side of the DC terminal of its own, or a DC ground fault of another abnormal electric power conversion apparatus has just been transmitted via the parallel connection point.

According to the present disclosure, a diagnostic function is provided which is effective for the DC ground fault, in a case where an electric power conversion system is constructed in which a plurality of the second electric power conversion apparatuses are connected to a parallel connection point without being connected via a transformer. This diagnostic function is realized by using the DC-side opening control. According to the DC-side opening control, it is possible to diagnose whether or not the DC ground fault has occurred on the side on which the DC voltmeter is provided, on the assumption that the DC voltmeter and the ground connection portion are provided on a side closer to the DC power source than the DC switch. By observing a change in the DC voltage accompanying the DC-side opening control, it is possible to discriminate whether the DC ground fault has occurred on a side of the DC terminal of its own, or a DC ground fault of another abnormal electric power conversion apparatus has just been transmitted via the parallel connection point.

DESCRIPTION OF EMBODIMENTS

Figure 1:
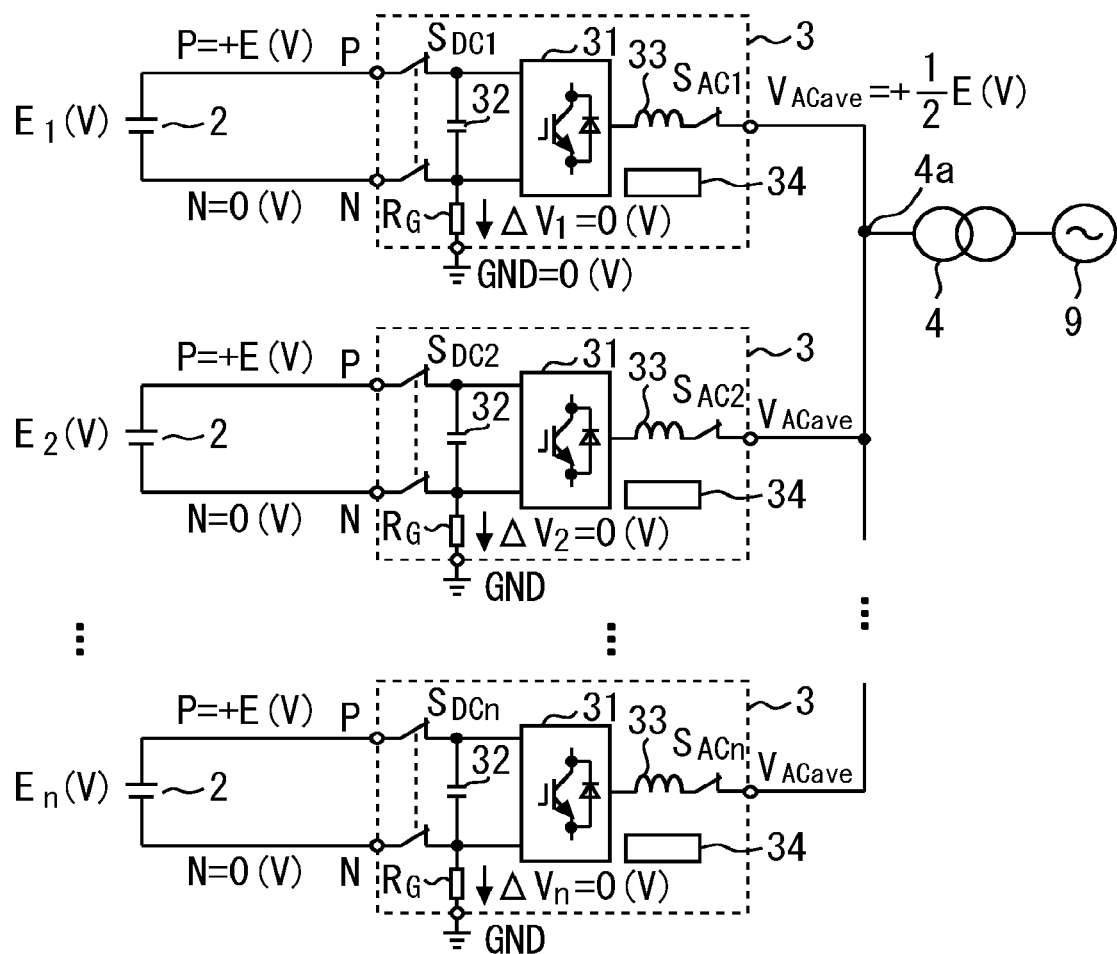
FIG. 1 is a diagram showing an electric power conversion apparatus and an electric power conversion system including the same, according to an embodiment.

FIG. 1 is a diagram showing an electric power conversion apparatus 3 and an electric power conversion system 1 including the same, according to an embodiment. The electric power conversion system 1 includes a plurality of DC power sources 2, a plurality of electric power conversion apparatuses 3, and an interconnection transformer 4.

The DC power source 2 may be a solar cell array or a storage battery. In the case of the storage battery or the like, directions of AC/DC conversion of the electric power conversion apparatus 3 may be any one. The DC power source 2 may be a DC power source system including a wind power generator and an AC/DC converter. The DC power source 2 has a voltage E. The plurality of DC power sources 2 do not necessarily have completely the same voltage E, and accordingly are referred to as voltages E1, E2, . . . and En, for the sake of distinction and convenience in some cases.

One of the DC power sources 2 and one of the electric power conversion apparatuses 3 are connected, respectively, and a total of n sets thereof are provided. Here, n is an arbitrary positive integer of 3 or larger. The AC terminals of each of the electric power conversion apparatuses 3 join at a parallel connection point 4a. The parallel connection point 4a is connected to one end of the interconnection transformer 4. The other end of the interconnection transformer 4 is connected to a public utility supply system 9.

Each of the electric power conversion apparatuses 3 includes an electric power conversion circuit 31, a DC switch $S_{DC}$, a DC capacitor 32, a DC voltmeter 35, an AC reactor 33, an AC switch $S_{AC}$, a ground connection portion $R_G$ and a control circuit 34. In FIG. 1, a positive electrode bus line is denoted by reference character P, and a negative electrode bus line is denoted by reference character N.

An insulating circuit element (for example, a transformer) is not provided between the AC reactor 33 and the parallel connection point 4a. At a normal time when a DC ground fault is not occurring, $V_{ACave}=+E/2$ is applied to the parallel connection point 4a.

Internal configurations of the electric power conversion apparatuses 3 are the same with each other, but for the sake of distinction and convenience of description, the electric power conversion apparatuses 3 are referred to as first, second, . . . and n-th electric power conversion apparatus 3, in order from the top to the bottom in FIG. 1 and FIG. 3 to FIG. 5, in some cases. Similarly, n switches of the DC switches $S_{DC}$ are described as $S_{DC1}$, $S_{DC2}$ and $S_{DCn}$, for the sake of distinction in some cases. Similarly, n switches of the AC switches $S_{AC}$ are described as $S_{AC1}$, $S_{AC2}$ and $S_{ACn}$, for the sake of distinction in some cases.

A positive electrode DC bus line and a negative electrode DC bus line are provided which connect the DC power source 2 with DC terminals 31p and 31n, respectively. The ground connection portion RG is a ground resistor RG which connects the negative electrode DC bus line with the ground potential $V_G$.

Figure 2:
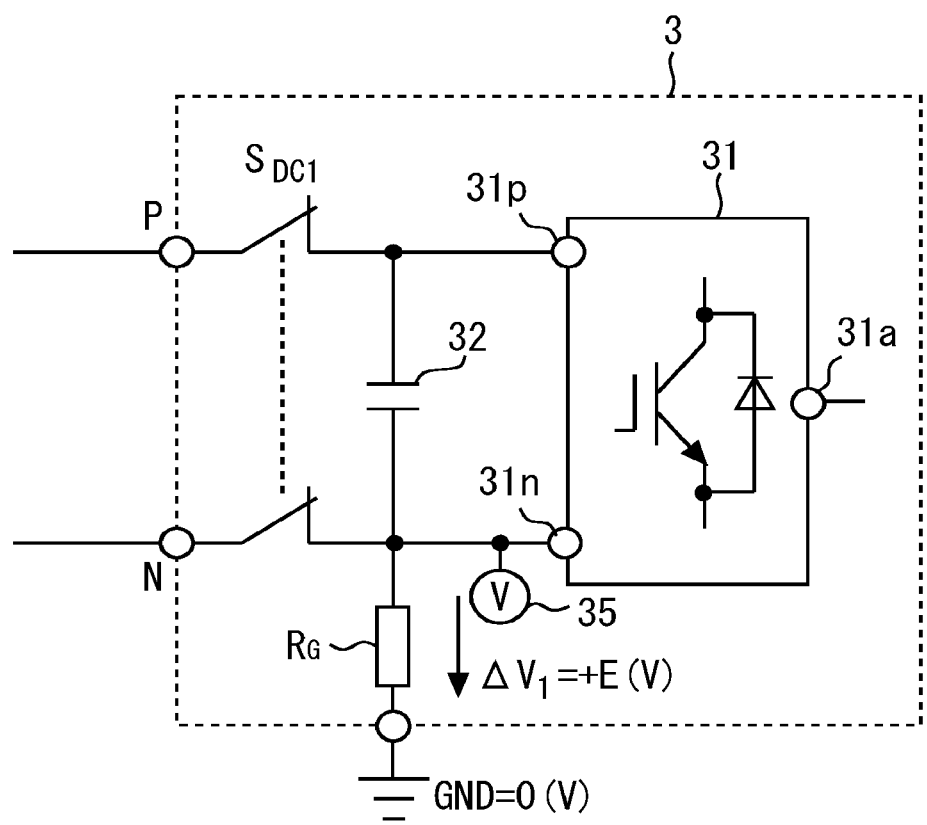
FIG. 2 is a diagram for explaining an internal configuration of the electric power conversion apparatus according to the embodiment.

FIG. 2 is a diagram for explaining the internal configuration of the electric power conversion apparatus 3 according to the embodiment. FIG. 2 shows the configuration of the first electric power conversion apparatus 3 for the sake of convenience, but the configurations of the second to nth electric power conversion apparatuses 3 are also the same.

The electric power conversion circuit 31 includes the DC terminals 31p and 31n and an AC terminal 31a. The DC terminals 31p and 31n are each connected to the DC power source 2 via the DC bus line. The electric power conversion circuit 31 converts DC power of the DC power source 2 into AC power. The AC power is output from the AC terminal 31a. The electric power conversion circuit 31 is a voltage-type inverter circuit and implements three-phase AC conversion. The number of phases of the electric power conversion circuit 31 is not limited to three phases, and may be single phase or two phases.

In each of the electric power conversion apparatuses 3, the DC switch $S_{DC}$ is provided between the DC power source 2 and the electric power conversion circuit 31. In each of the electric power conversion apparatuses 3, the AC switch $S_{AC}$ is provided between the AC reactor 33 on the side of the AC terminal 31a and the parallel connection point 4a. At the time of the electric power conversion of the electric power conversion circuit 31, the DC switch $S_{DC}$ and the AC switch $S_{AC}$ are turned on.

The DC voltmeter 35 measures a potential at a predetermined portion which has been determined beforehand, on sides of the DC terminals 31p and 31n. The ground connection portion $R_G$ connects the DC bus line with the ground potential. The DC voltmeter 35 measures a potential difference $\Delta V$ between a potential $V_N$ of the negative electrode (N-electrode) bus line and the ground potential $V_G$. For information, the DC voltmeter 35 is an example of means by which the control circuit 34 recognizes the potential difference $\Delta V$, and the form thereof is not limited.

The "DC ground fault voltage" is a behavior of a DC voltage by which the occurrence of the DC ground fault 5 is suspected. To the ground resistor $R_G$, a potential difference $\Delta V$ between the negative electrode DC bus line and the ground potential is applied. The DC voltmeter 35 measures the potential difference $\Delta V$. When the potential difference $\Delta V$ exceeds a ground fault determination value $A_G$ which has been determined beforehand, the control circuit 34 detects that the DC ground fault voltage has been generated. In addition, $\Delta V = V_G - V_N$.

In each of the electric power conversion apparatuses 3, the control circuit 34 is connected to the electric power conversion circuit 31, the DC switch $S_{DC}$, the AC switch $S_{AC}$ and the DC voltmeter 35. The control circuit 34 implements such a control necessary for DC/AC conversion of the electric power conversion apparatus 3, as to generate a control signal for controlling a semiconductor switching element included in the electric power conversion circuit 31.

Figure 3:
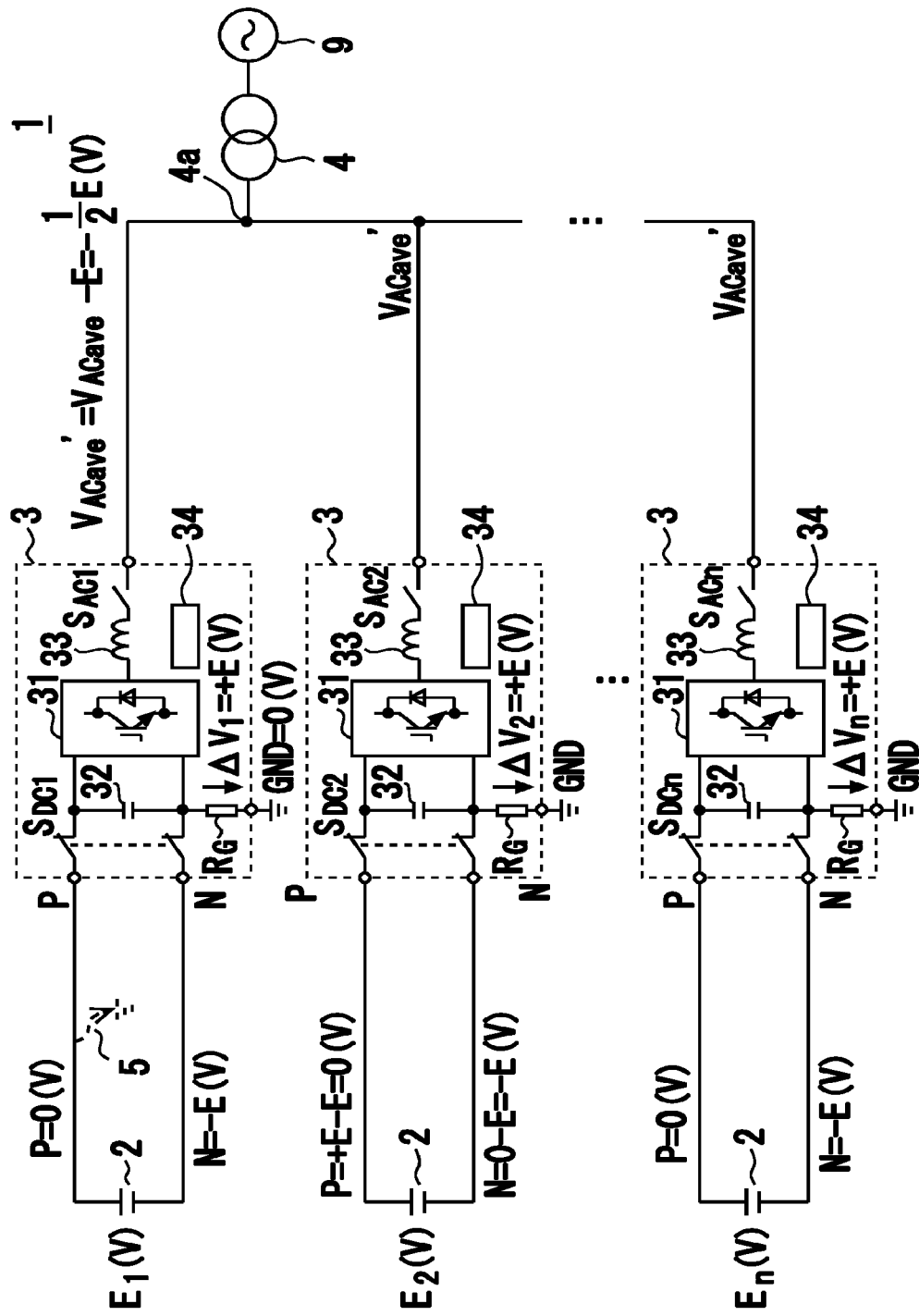
FIG. 3 is a diagram for explaining an operation of the electric power conversion apparatus and the electric power conversion system including the same, according to the embodiment.
Figure 4:
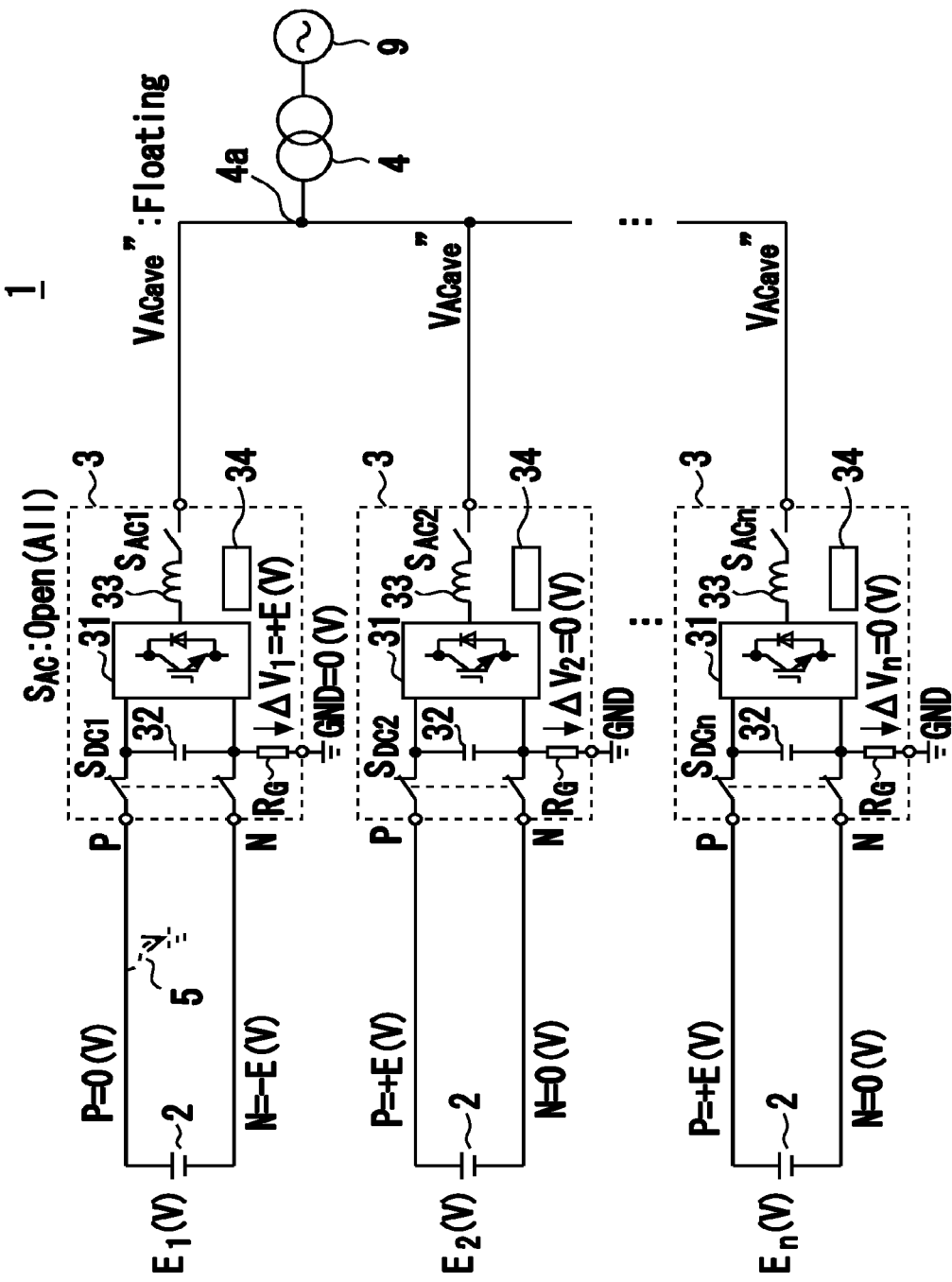
FIG. 4 is a diagram for explaining an operation of the electric power conversion apparatus and the electric power conversion system including the same, according to the embodiment.
Figure 5:
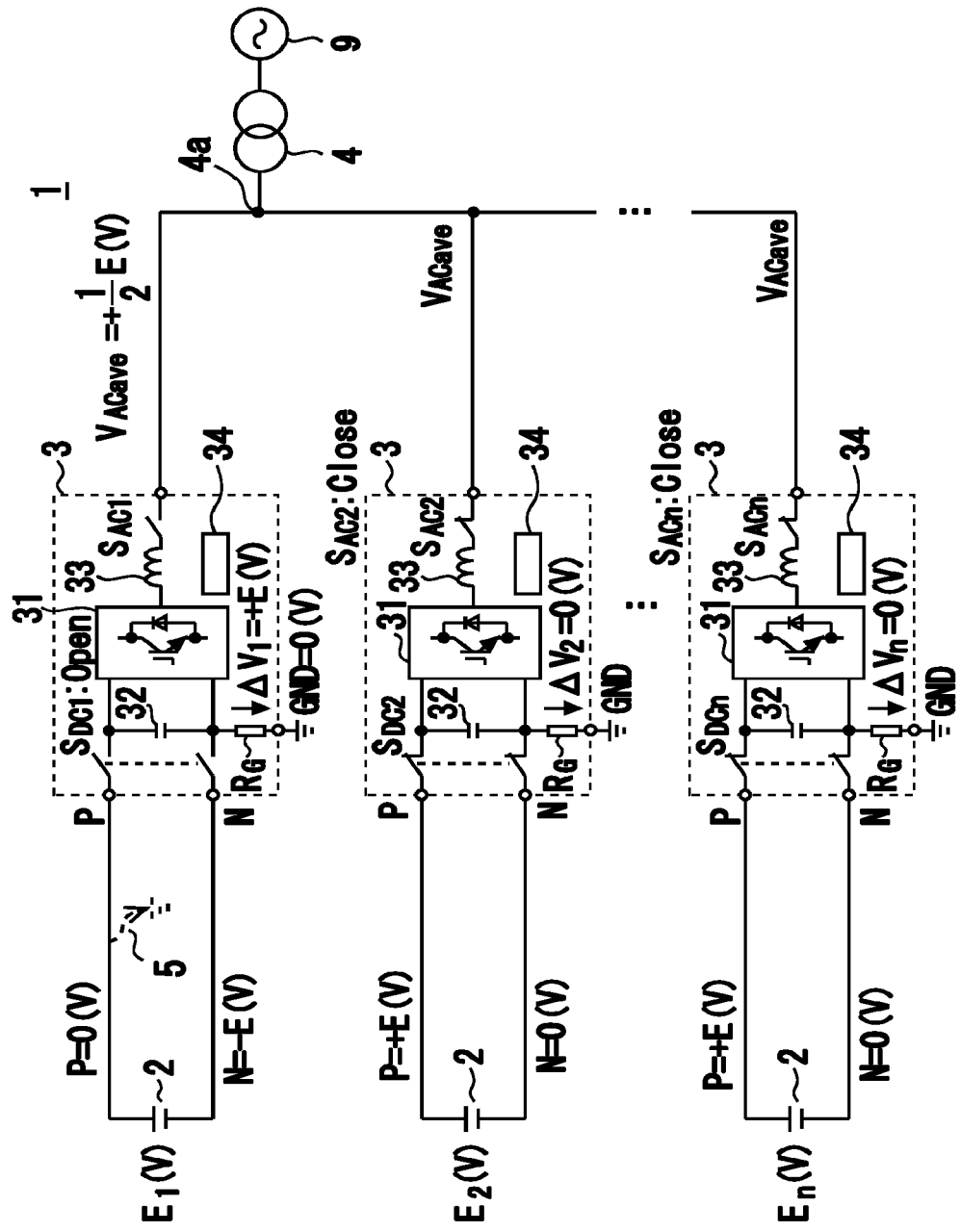
FIG. 5 is a diagram for explaining an operation of the electric power conversion apparatus and the electric power conversion system including the same, according to the embodiment.
Figure 6:
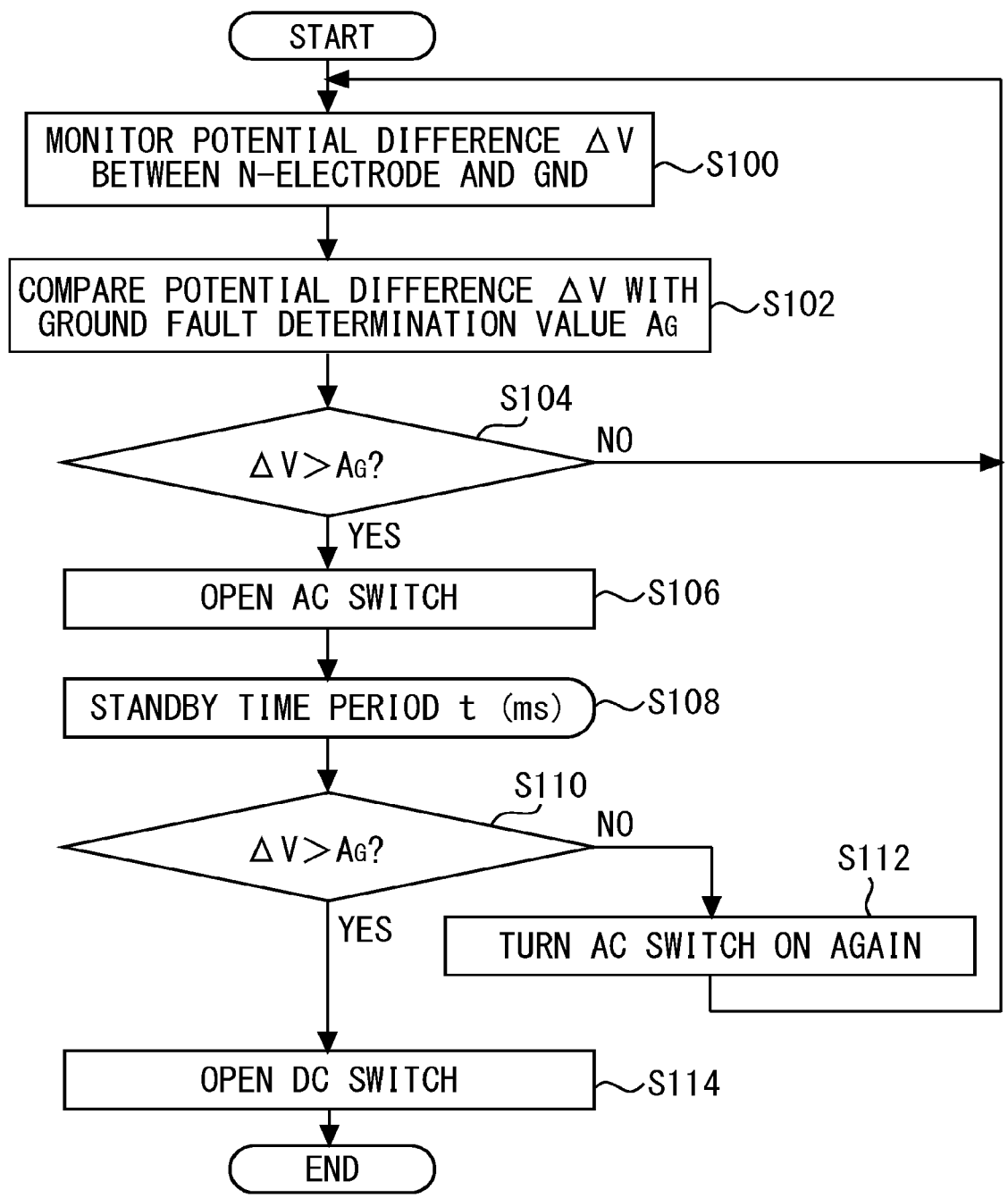
FIG. 6 is a flowchart for explaining control processing (AC-side opening control) which is executed in the electric power conversion apparatus according to the embodiment.

FIG. 3 to FIG. 5 are diagrams for explaining operations of the electric power conversion apparatus 3 and the electric power conversion system 1 including the same, according to the embodiment. FIG. 6 is a flowchart for explaining control processing (AC-side opening control) which is executed in the electric power conversion apparatus 3 according to the embodiment.

FIG. 3 shows a state in which the DC ground fault 5 occurs in the first electric power conversion apparatus 3. The DC ground fault 5 is a ground fault which has occurred in the positive electrode DC bus line. The electric power conversion system 1 has a configuration in which a plurality of electric power conversion apparatuses 3 are connected in parallel via a parallel connection point 4a without being connected via a transformer. In this case, when the DC ground fault 5 occurs in at least one abnormal electric power conversion apparatus 3, the DC ground fault voltage is transmitted also to the other normal electric power conversion apparatuses 3 via the parallel connection point 4a. Specifically, the potential of a positive electrode P and the potential of a negative electrode N each decrease by E (V). In addition, $V_{ACave}$ in FIG. 1 becomes the following $V_{ACave}'$, in FIG. 3.

$$V_{ACave}' = V_{ACave} - E = -E/2$$

The control circuit 34 detects whether or not the DC ground fault voltage has been generated on the basis of a measurement value of the DC voltmeter 35, while the electric power conversion circuit 31 performs the electric power conversion. Specifically, in step S100 in FIG. 6, the potential difference ΔV is monitored, and in step S102, ΔV is compared with the ground fault determination value $A_G$. In a case where $\Delta V > A_G$ has held in step S104, it is determined that the DC ground fault voltage has been generated.

In the case where the DC ground fault voltage has been generated, the control circuit 34 executes AC-side opening control of opening the AC switches $S_{AC1}$ to $S_{ACn}$, while keeping the DC switches $S_{DC1}$ to $S_{DCn}$ turned on (step S106). At the time of the AC-side opening control, an electric power to be output from the electric power conversion circuit 31 is controlled to be 0.

FIG. 4 shows a state after each of the electric power conversion apparatuses 3 has implemented the AC-side opening control. By the AC switches $S_{AC1}$ to $S_{ACn}$ being opened (Open), the potential $V_{ACave}''$ of the parallel connection point 4a becomes floating.

The first electric power conversion apparatus 3 is an abnormal electric power conversion apparatus 3 in which the DC ground fault 5 has occurred. In the abnormal electric power conversion apparatus 3, the DC ground fault 5 occurs on the side of the DC terminals 31p and 31n, and accordingly, still after the AC-side opening control, the DC ground fault voltage remains as it is. In other words, the potential of the positive electrode P remains 0 (V), and the potential of the negative electrode N remains −E (V).

On the other hand, when looking at the second to nth normal electric power conversion apparatuses 3, the DC ground fault 5 is not occurring on the sides of the DC terminals 31p and 31n of the normal electric power conversion apparatuses 3, even though the DC ground fault voltage is detected at the stage in FIG. 3. Accordingly, when the AC-side opening control is performed, in the normal electric power conversion apparatus 3, the influence of the DC ground fault voltage which has been transmitted through the parallel connection point 4a disappears. As a result, the DC voltage value of the normal electric power conversion apparatus 3 is restored to the normal range. In other words, on the sides of DC terminals of the second to nth normal electric power conversion apparatuses 3, the potential of the positive electrode P is restored to +E (V), and the potential of the negative electrode N is restored to 0 (V).

By thus utilizing the mechanism in which the AC-side opening control acts on the voltages on the sides of the DC terminals 31p and 31n, the cause of the generation of the DC ground fault voltage can be discriminated. This is because it is possible to distinguish whether the DC ground fault 5 has occurred on the side of its own DC terminals 31p and 31n, or the DC ground fault 5 of another abnormal electric power conversion apparatus 3 has been just transmitted, by observing a change in the DC voltage accompanying the AC-side opening control.

In order to realize the above operation, the control circuit 34 firstly waits until the standby time period t (ms) elapses after step S106 (step S108) in the control flow in FIG. 6. The standby time period t may be set to be several milliseconds, for example. By providing the standby time period t, it is possible to secure a time period necessary for the influence of the DC ground fault voltage to disappear in the normal electric power conversion apparatus 3.

After that, the determination processing of step S104 is implemented again in step S110.

In a case where the DC ground fault voltage has been restored to the normal voltage in response to the AC-side opening control (in a case of NO in step S110), the control circuit 34 determines that the DC ground fault 5 is not occurring on the sides of the DC terminals 31p and 31n. As is shown in FIG. 5, the control circuit 34 again turns on the AC switches $S_{AC2}$, . . . , to $S_{ACn}$ that are provided in the second to nth electric power conversion apparatuses 3, respectively, which are normal electric power conversion apparatuses (step S112). After the restart, the electric power conversion operation of the electric power conversion apparatus 3 is reopened.

In a case where the DC ground fault voltage is not restored to the normal voltage in response to the AC-side opening control, the control circuit 34 determines that the DC ground fault 5 has occurred on the sides of the DC terminals 31p and 31n. As is shown in FIG. 5, the control circuit 34 keeps the AC switch $S_{AC1}$ opened for the abnormal electric power conversion apparatus 3 in which the DC ground fault 5 has occurred, and further opens the DC switch $S_{DC1}$ (step S114). The first electric power conversion apparatus 3 is completely stopped due to the occurrence of the abnormality. In response to this, the control circuit 34 may output a notification signal which indicates that the DC ground fault 5 has occurred.

As described above, in the case where the electric power conversion system 1 is constructed in which the plurality of electric power conversion apparatuses 3 are connected to the parallel connection point 4a without being connected via a transformer, an effective diagnosis function of the DC ground fault 5 is provided. According to this diagnosis function, it is possible to diagnose whether or not the DC ground fault voltage is generated, by utilizing the mechanism in which the AC-side opening control acts on the voltage on the sides of the DC terminals 31p and 31n. This is because it is possible to discriminate whether the DC ground fault 5 has occurred on the side of its own DC terminals 31p and 31n, or the DC ground fault 5 of another abnormal electric power conversion apparatus 3 has been just transmitted via the parallel connection point 4a, by observing a change in the DC voltage accompanying the AC-side opening control.

Figure 7:
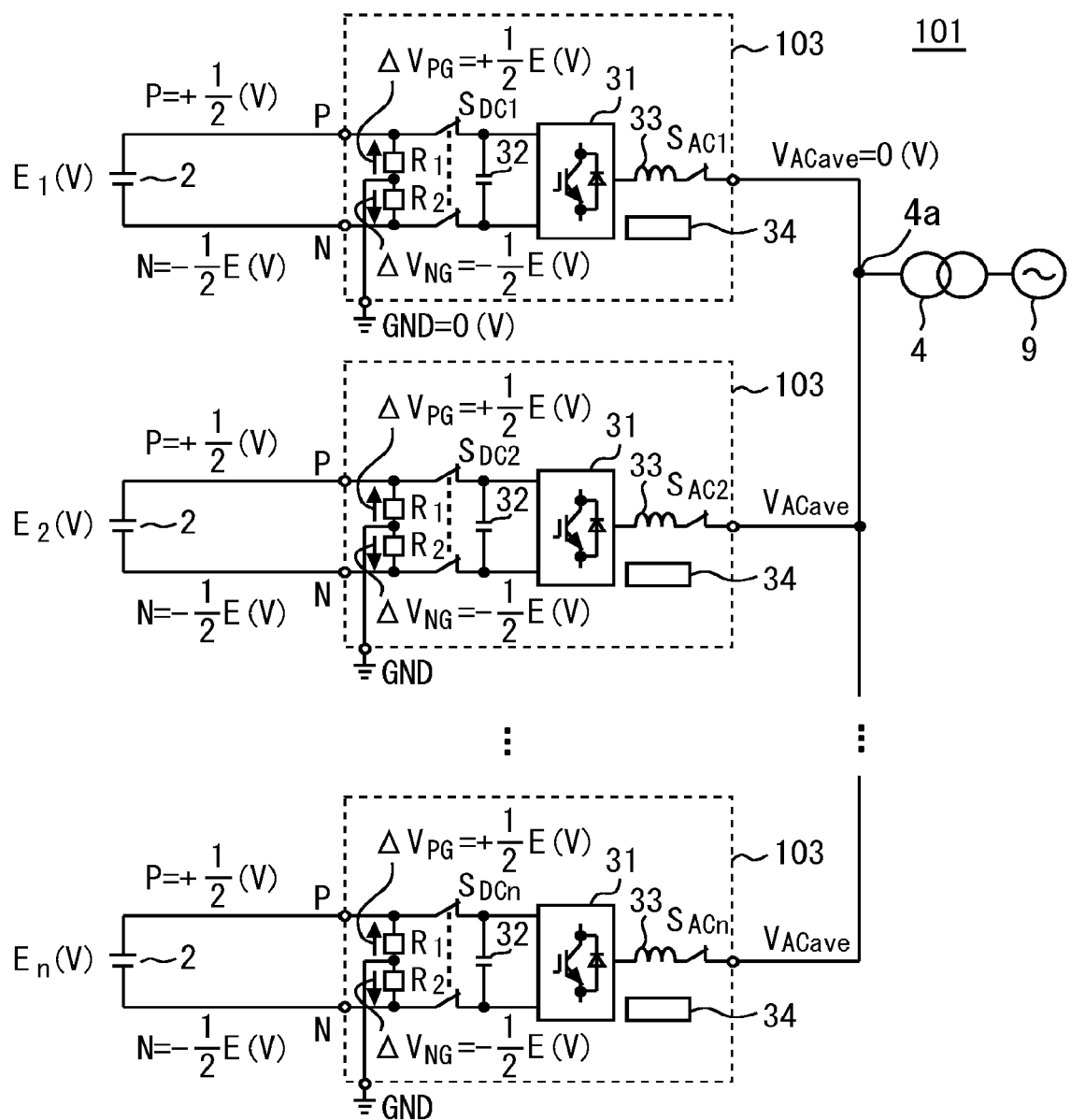
FIG. 7 is a diagram showing an electric power conversion apparatus and an electric power conversion system including the same, according to a modified example of the embodiment.

FIG. 7 is a diagram showing an electric power conversion apparatus 103 and an electric power conversion system 101 including the same, according to a modified example of the embodiment. The differences between FIG. 1 and FIG. 7 are the following two points. The first point of difference is that the ground connection portions $R_1$ and $R_2$ including voltage dividing resistance circuits $R_1$ and $R_2$ are used instead of the ground resistance $R_G$. In other words, in the configuration in FIG. 7, a non-grounding system is adopted. Thereby, there is an advantage of being capable of detecting both of a positive electrode (P-electrode) ground fault and a negative electrode (N-electrode) ground fault. The second point of difference is that the DC voltmeter 35 and the ground connection portions $R_1$ and $R_2$ are provided on the side of the DC power source 2, when the DC switch $S_{DC}$ is regarded as a reference position. Accordingly, there is an advantage that "DC-side opening control" may be implemented which will be described later.

The ground connection portions $R_1$ and $R_2$ have voltage dividing resistance circuits $R_1$ and $R_2$ which include a plurality of resistors $R_1$ and $R_2$ that are connected in series. One end of the voltage dividing resistance circuits $R_1$ and $R_2$ is connected to a positive electrode DC bus line, and the other end of the voltage dividing resistance circuits $R_1$ and $R_2$ is connected to the negative electrode DC bus line. An intermediate connection point between the plurality of resistors $R_1$ and $R_2$ included in the voltage dividing resistance circuits $R_1$ and $R_2$ is connected to the ground potential.

As is shown in FIG. 7, a positive electrode side potential difference $\Delta V_{PG}$ between the positive electrode DC bus line and the ground potential, and a negative electrode side potential difference $\Delta V_{NG}$ between the negative electrode DC bus line and the ground potential are obtained from the voltage dividing resistance circuits $R_1$ and $R_2$, respectively. Specifically, $\Delta V_{PG}=+E/2$ (V), and $\Delta V_{NG}=-E/2$ (V).

Figure 8:
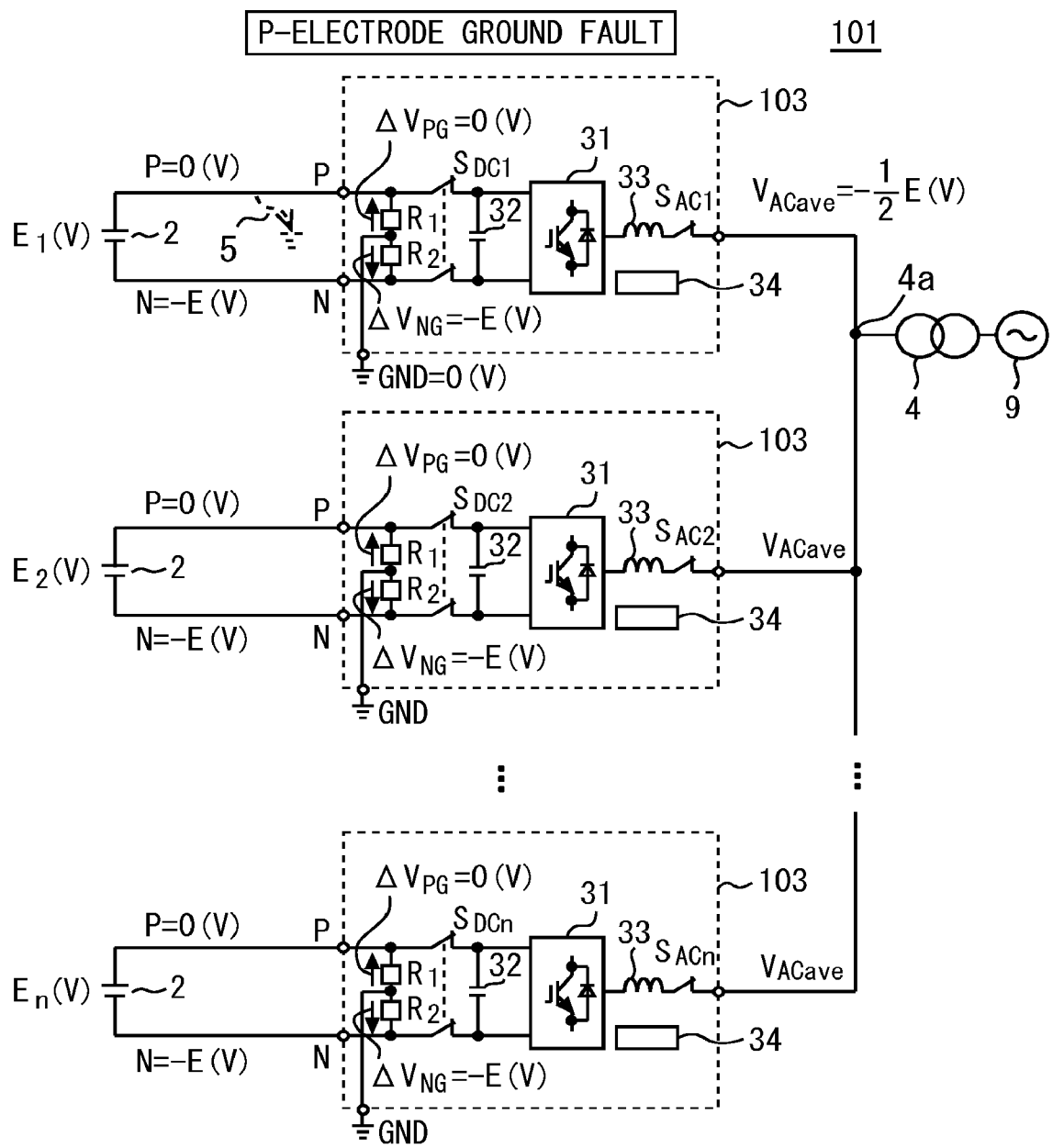
FIG. 8 is a diagram for explaining an operation of the electric power conversion apparatus and the electric power conversion system including the same, according to the modified example of the embodiment.
Figure 9:
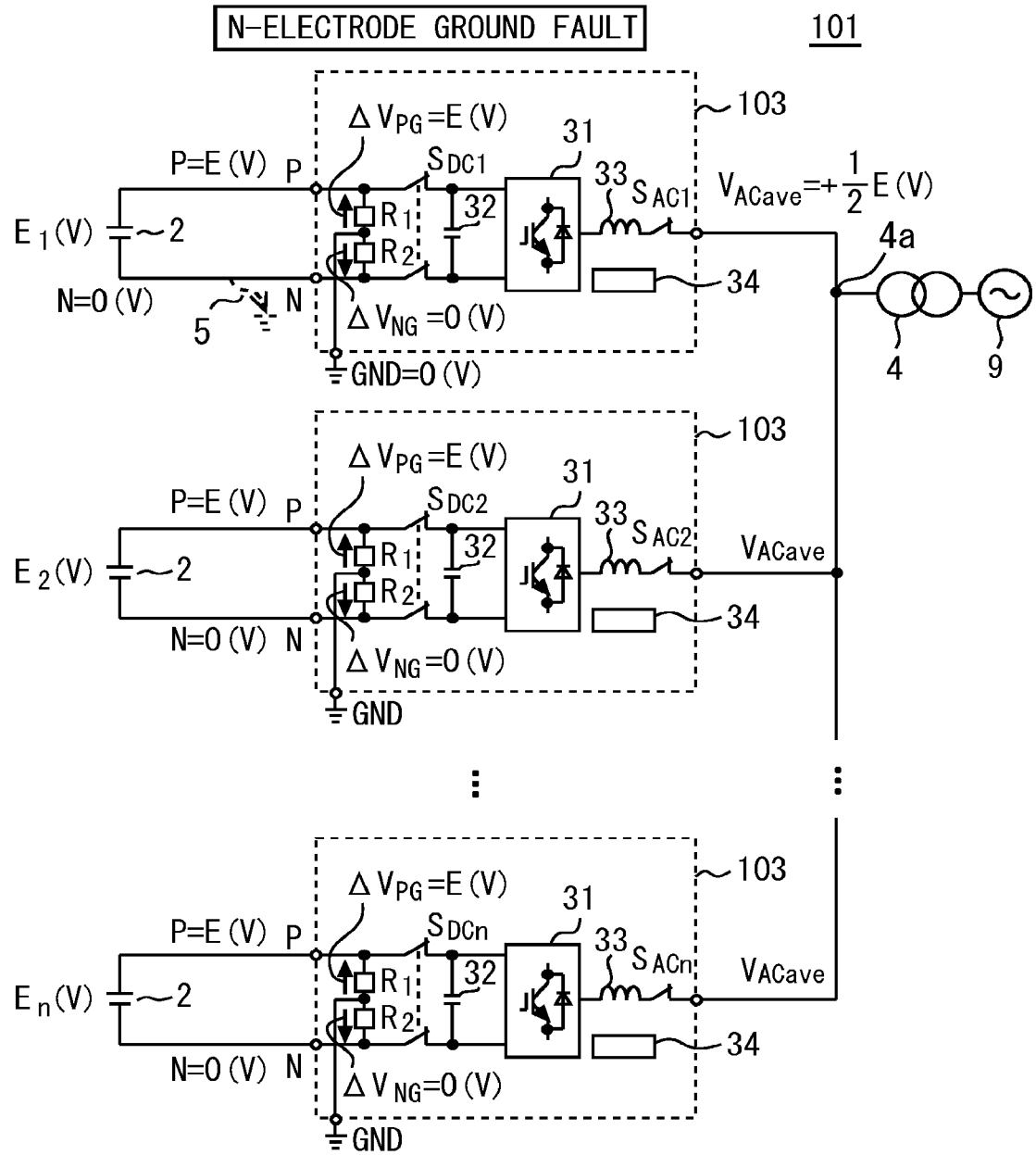
FIG. 9 is a diagram for explaining an operation of the electric power conversion apparatus and the electric power conversion system including the same, according to the modified example of the embodiment.
Figure 10:
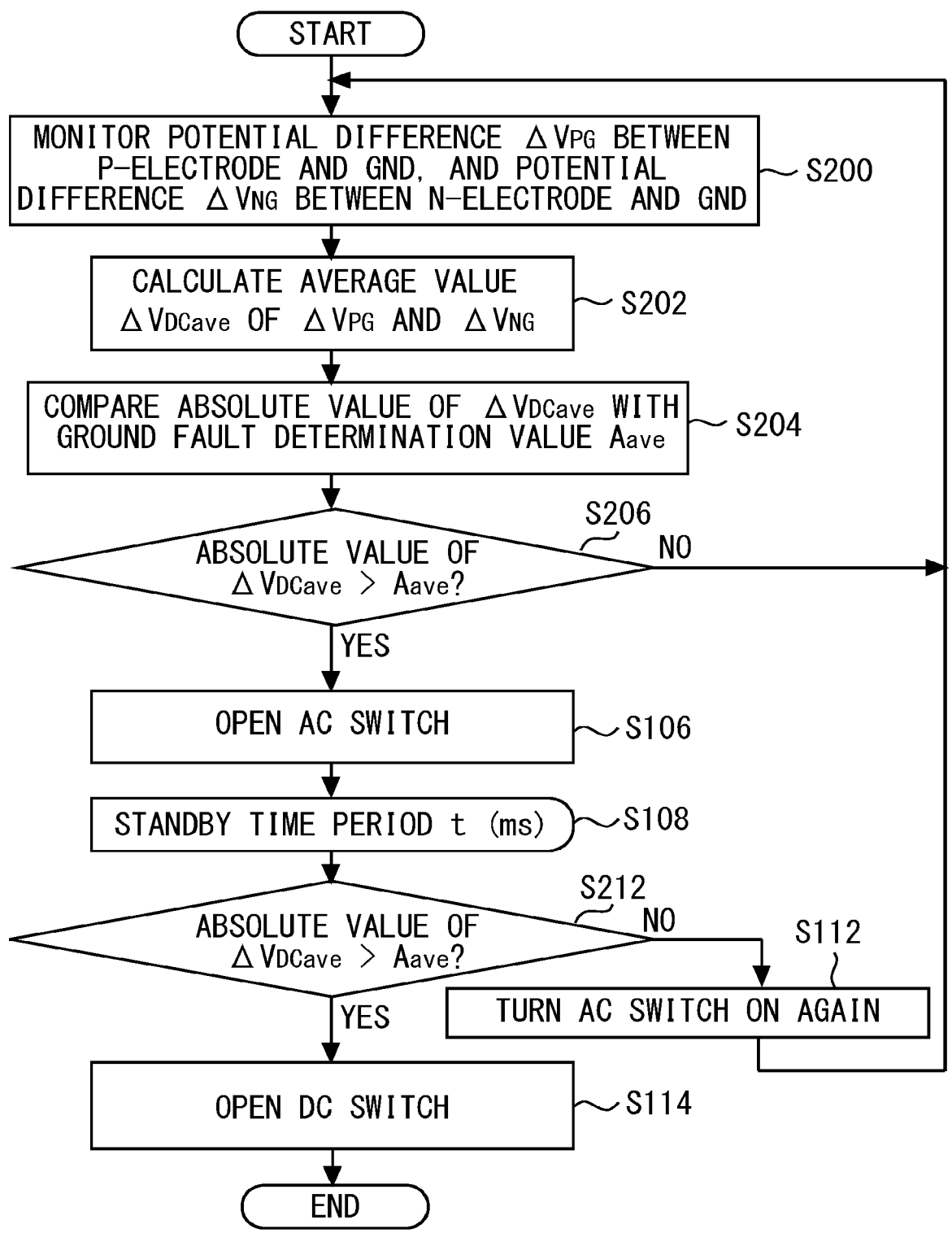
FIG. 10 is a flowchart for explaining control processing (AC-side opening control) which is executed in the electric power conversion apparatus according to the modified example of the embodiment.

FIG. 8 and FIG. 9 are diagrams for explaining an operation of the electric power conversion apparatus 103 and the electric power conversion system 101 including the same, according to the modified example of the embodiment. FIG. 8 shows a state in which the positive electrode (P-electrode) ground fault has occurred. FIG. 9 shows a state in which the negative electrode (N-electrode) ground fault has occurred. FIG. 10 is a flowchart for explaining control processing (AC-side opening control) which is executed in the electric power conversion apparatus 103 according to the modified example of the embodiment.

In the flowchart in FIG. 10, firstly, the control circuit 34 monitors the positive electrode side potential difference $\Delta V_{PG}$ and the negative electrode side potential difference $\Delta V_{NG}$ which have been measured by the DC voltmeters 35 (step S200).

The control circuit 34 may detect the DC ground fault voltage on the basis of at least one of the following plurality of detection methods. As one example, the control circuit 34 may calculate an average value $\Delta V_{DCave}$ of the positive electrode side potential difference $\Delta V_{PG}$ and the negative electrode side potential difference $\Delta V_{NG}$; and when the absolute value of the average value $\Delta V_{DCave}$ has exceeded an average ground fault determination value $A_{ave}$ which has been determined beforehand, may detect that a DC ground fault voltage has been generated. As another example, when the absolute value of the positive electrode side potential difference $\Delta V_{PG}$ has exceeded another first ground fault determination value which has been determined beforehand, the generation of the DC ground fault voltage may be detected. As another example, when the absolute value of the negative electrode side potential difference $\Delta V_{NG}$ has exceeded another second ground fault determination value which has been determined beforehand, the generation of the DC ground fault voltage may be detected. By utilizing the voltage dividing resistance circuits $R_1$ and $R_2$, it is possible to detect both of the positive electrode DC ground fault 5 in FIG. 8 and the negative electrode DC ground fault 5 in FIG. 9.

In a flowchart in FIG. 10, among the above detection methods, the comparison determination between the absolute value of the average value $\Delta V_{DCave}$ and the average ground fault determination value $A_{ave}$ is used as one example. In step S202, the absolute value of the average value $\Delta V_{DCave}$ is calculated on the basis of the following expression.

$$\Delta V_{DCave}=|\Delta V_{PG}+\Delta V_{NG}|/2$$

Furthermore, in step S204, $\Delta V_{DCave}$ is compared with $A_{ave}$. Step S206 in FIG. 10 is a determination routine which determines that the DC ground fault voltage has been detected, when $\Delta V_{DCave}>A_{ave}$ has held, and corresponds to step S104 in FIG. 6. Step S212 in FIG. 10 is a determination routine which determines that the DC ground fault 5 occurs in its own DC terminal, when $\Delta V_{DCave}>A_{ave}$ has held, and corresponds to step S110 in FIG. 6. Steps S106, S108, S112 and S114 are the same as in FIG. 6.

Figure 11:
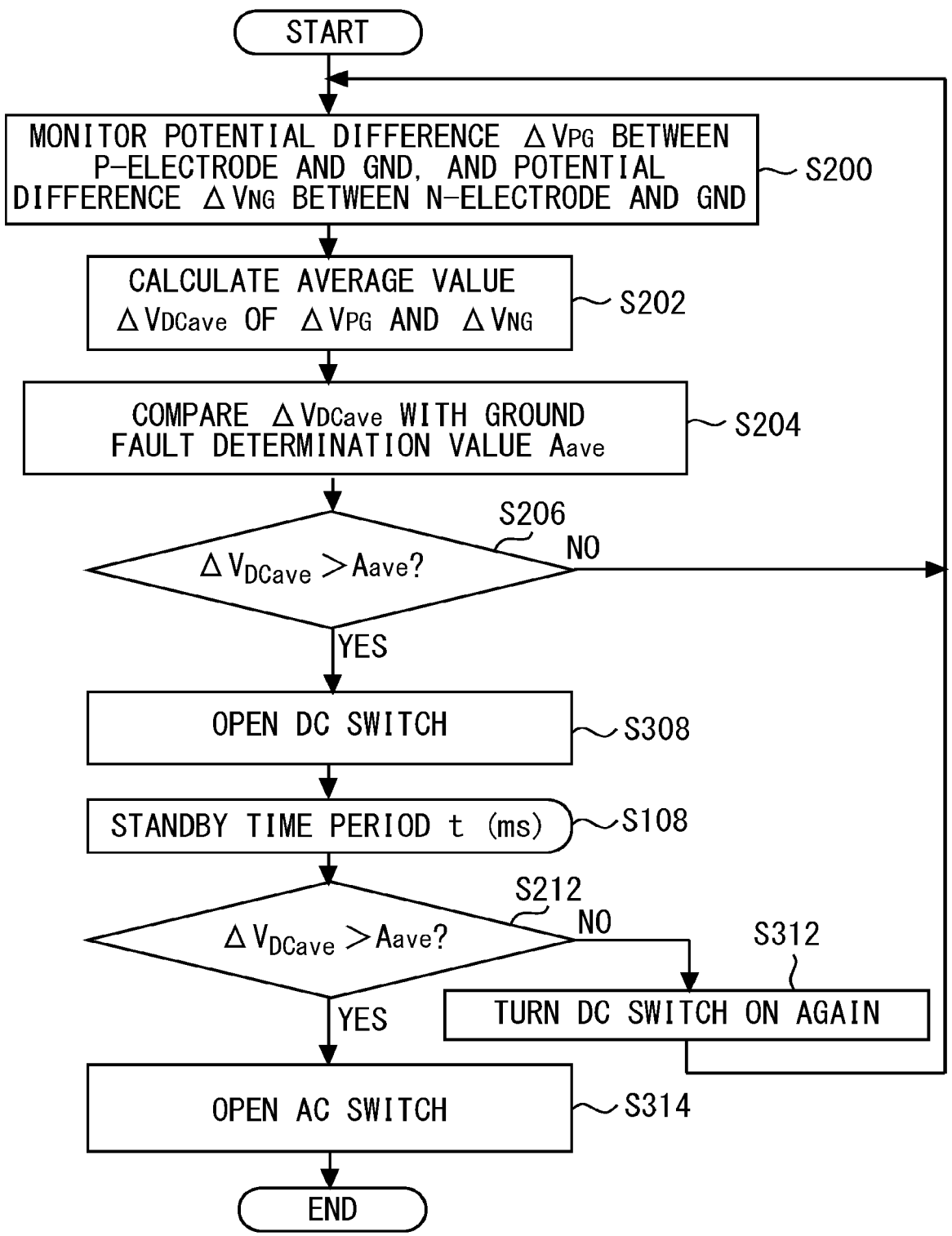
FIG. 11 is a flowchart for explaining control processing (DC-side opening control) which is executed in the electric power conversion apparatus according to the modified example of the embodiment.

FIG. 11 is a flowchart for explaining control processing (DC-side opening control) which is executed in the electric power conversion apparatus 103 according to the modified example of the embodiment. The flowchart in FIG. 11 shows the control of the modified example, which the control circuit 34 executes in a hardware configuration described in FIG. 7. Points of difference between the flowcharts in FIG. 10 and FIG. 11 are steps S308, S312 and S314. Steps S200, S202, S204, S206, S108 and S212 are the same as those in FIG. 10, and accordingly the description will be omitted.

In a case where it has been detected that the DC ground fault voltage has been generated in step S206, the control circuit 34 executes the DC-side opening control of opening the DC switch $S_{DC}$ (step S308). At the time of the DC-side opening control, an electric power to be output from the electric power conversion circuit 31 is controlled to be 0.

In the first abnormal electric power conversion apparatus 103, the DC ground fault 5 occurs on the sides of the DC terminals 31p and 31n. In a case where the DC voltmeter 35 is provided on a side of the DC power source 2, and the DC ground fault 5 occurs on the side of the DC power source 2, the DC ground fault voltage remains as it is in the abnormal electric power conversion apparatus 103, still after the DC-side opening control. On the other hand, in second to nth normal electric power conversion apparatuses 103, the influence of the DC ground fault 5 disappears in response to the DC-side opening control, and thereby, the DC voltage is restored to a normal voltage by an electric current that has passed through the ground connection portions $R_1$ and $R_2$.

By observing a change in the DC voltage in response to the DC-side opening control, it is possible to discriminate the generation cause of the DC ground fault voltage which has been generated on the side on which the DC voltmeter 35 has been provided, on the assumption that the DC voltmeter 35 and the ground connection portions $R_1$ and $R_2$ are provided on sides closer to the DC power source 2 than the DC switch $S_{DC}$. This is because it is possible to distinguish whether the DC ground fault 5 has occurred on the side of its own DC terminals 31p and 31n, or the DC ground fault 5 of another abnormal electric power conversion apparatus 103 has been just transmitted, by observing a change in the DC voltage accompanying the DC-side opening control.

In a case where the DC ground fault voltage has been restored to the normal voltage in response to the DC-side opening control (in a case of NO in step S212), the control circuit 34 determines that the DC ground fault 5 is not occurring in its own DC terminal. In this case, the control circuit 34 turns on the DC switch $S_{DC}$ again (step S312).

In FIG. 8 and FIG. 9, the second to nth electric power conversion apparatuses 103 are normal electric power conversion apparatuses in which the DC ground fault 5 is not occurring, accordingly the DC ground fault voltage is restored to the normal voltage, and thereby the determination result of step S212 becomes NO. Accordingly, the DC switches $S_{DC2}$ to $S_{DCn}$ are turned on again which these normal electric power conversion apparatuses have.

In a case where the DC ground fault voltage is not restored to the normal voltage in response to the DC-side opening control (in a case of YES in step S212), the control circuit 34 determines that the DC ground fault 5 has occurred at its own DC terminal. In this case, the control circuit 34 opens the AC switch $S_{AC}$ (step S314).

In FIG. 8 and FIG. 9, the first electric power conversion apparatus 103 is an abnormal electric power conversion apparatus in which the DC ground fault 5 occurs, accordingly the DC ground fault voltage is not restored to the normal voltage, and thereby the determination result in step S212 becomes YES. Therefore, the AC switch $S_{AC1}$ is opened which the first electric power conversion apparatus 103 has.

As described above, according to the flowchart in FIG. 11, in the case where the electric power conversion system 101 is constructed in which the plurality of electric power conversion apparatuses 103 are connected to the parallel connection point 4a without being connected via a transformer, an effective diagnosis function of the DC ground fault 5 is provided. According to this diagnosis function, it is possible to diagnose whether or not the DC ground fault 5 has occurred on the side on which the DC voltmeter 35 is provided, on the assumption that the DC voltmeter 35 and the ground connection portions $R_1$ and $R_2$ are provided on the sides closer to the DC power source 2 than the DC switch $S_{DC}$. This is because it is possible to discriminate whether the DC ground fault 5 has occurred on the side of its own DC terminals 31p and 31n, or the DC ground fault 5 of another abnormal electric power conversion apparatus 103 has been just transmitted via the parallel connection point 4a, by observing a change in the DC voltage accompanying the DC-side opening control.

As a modified example, the ground connection portions $R_1$ and $R_2$ in FIG. 7 to FIG. 9 may be replaced with the ground connection portion $R_G$ (ground resistor $R_G$) in FIG. 1 or the like, and the DC-side opening control according to the flowchart in FIG. 11 described above may be executed in the configuration after the replacement.

FIG. 12 to FIG. 15 are diagrams for explaining internal configurations of the electric power conversion apparatuses 3 and 103 and peripheral circuits thereof according to modified examples of the embodiment. The positional variations of the ground connection portion $R_G$ and the ground connection portions $R_1$ and $R_2$ include a first position on the sides closer to the DC power source 2 than the DC switch $S_{DC}$, and a second position on the sides closer to the electric power conversion circuit 31 than the DC switch $S_{DC}$. The positional variation of the DC voltmeter 35 includes a third position on the side closer to the DC power source 2 than the DC switch $S_{DC}$, and a fourth position on the side closer to the electric power conversion circuit 31 than the DC switch $S_{DC}$. For information, in the case of the first position described above, there are cases where the ground connection portion $R_G$ or the ground connection portions $R_1$ and $R_2$ are provided inside the housing of the electric power conversion apparatuses 3 and 103, or are provided outside the housing thereof, but the first position may be any one of the inside and outside of the housing.

There are a combination of the first position and the third position, a combination of the first position and the fourth position, a combination of the second position and the third position, and a combination of the second position and the fourth position. The following Table 1 summarizes the combinations of these positional relationships, corresponding figures, and which of the AC-side opening control or the DC-side opening control can be used.

TABLE 1

Figure 12:
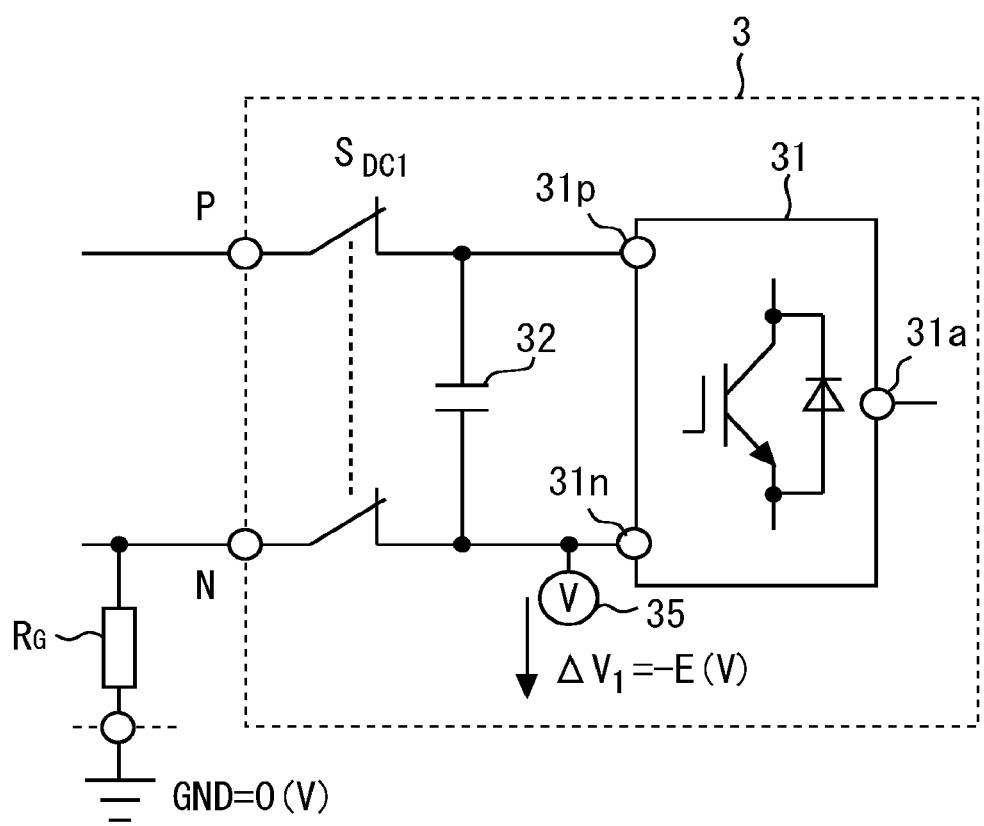
FIG. 12 is a diagram for explaining an internal configuration of the electric power conversion apparatus and a peripheral circuit thereof, according to the modified example of the embodiment.
Figure 13:
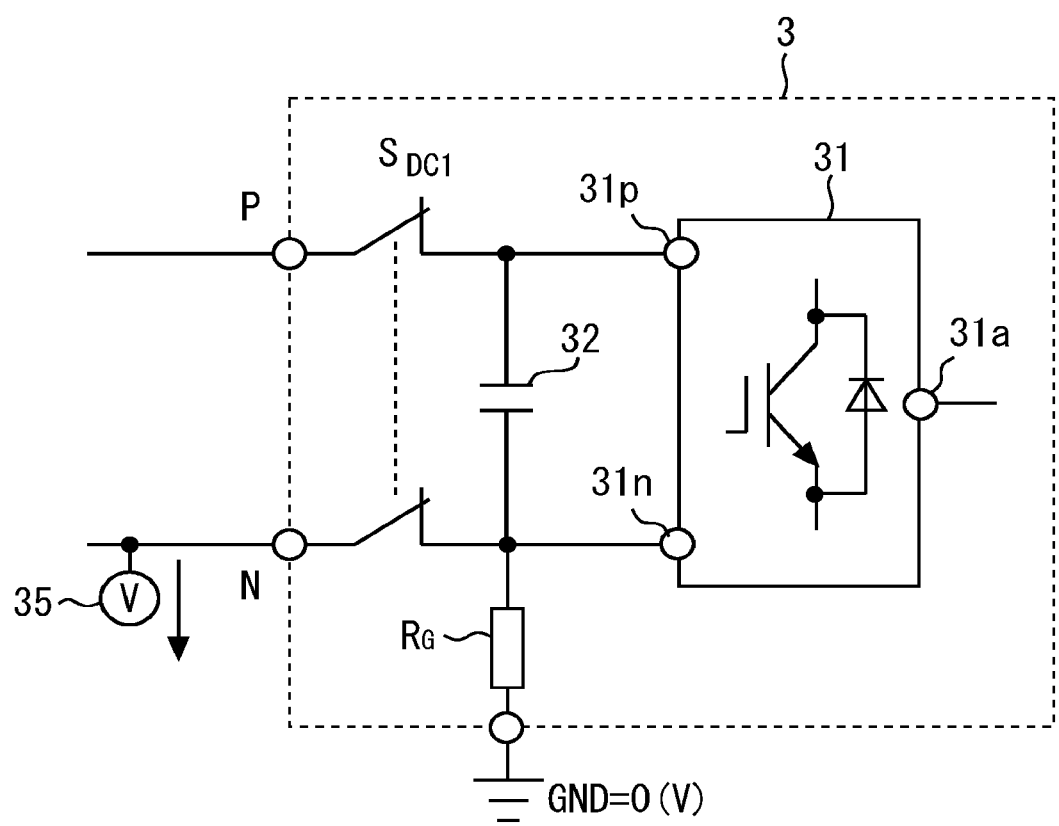
FIG. 13 is a diagram for explaining an internal configuration of the electric power conversion apparatus and the peripheral circuit thereof, according to the modified example of the embodiment.
Figure 14:
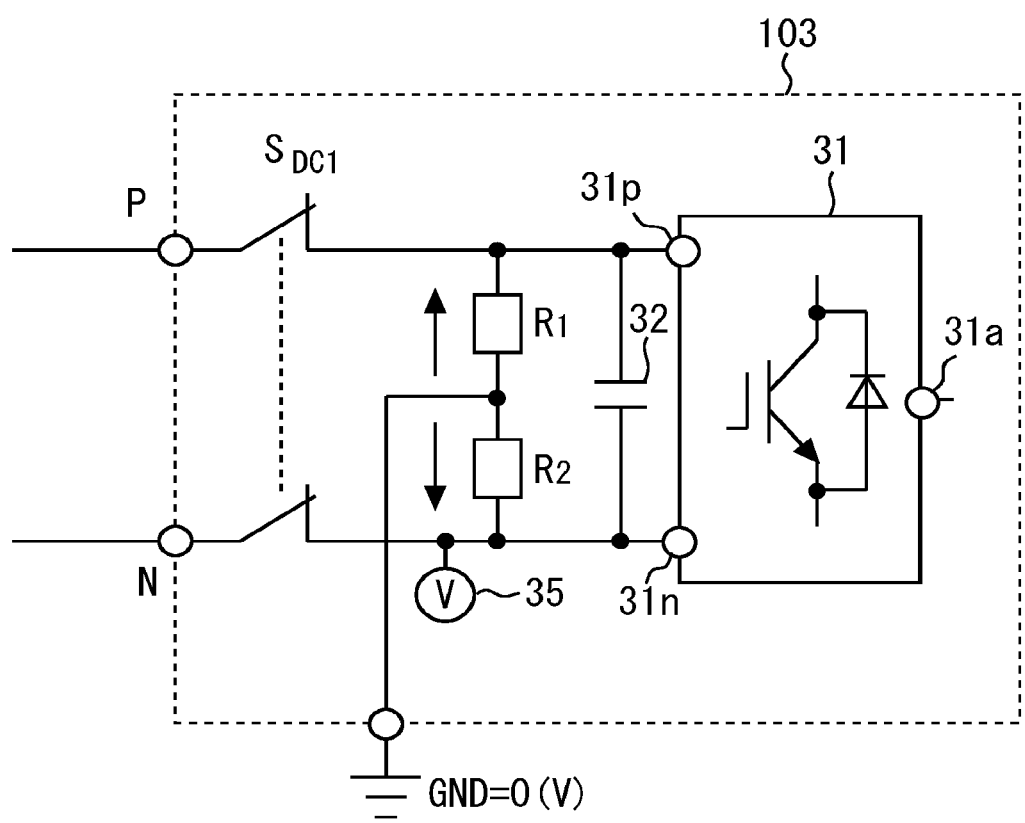
FIG. 14 is a diagram for explaining an internal configuration of the electric power conversion apparatus and the peripheral circuit thereof, according to the modified example of the embodiment.
Figure 15:
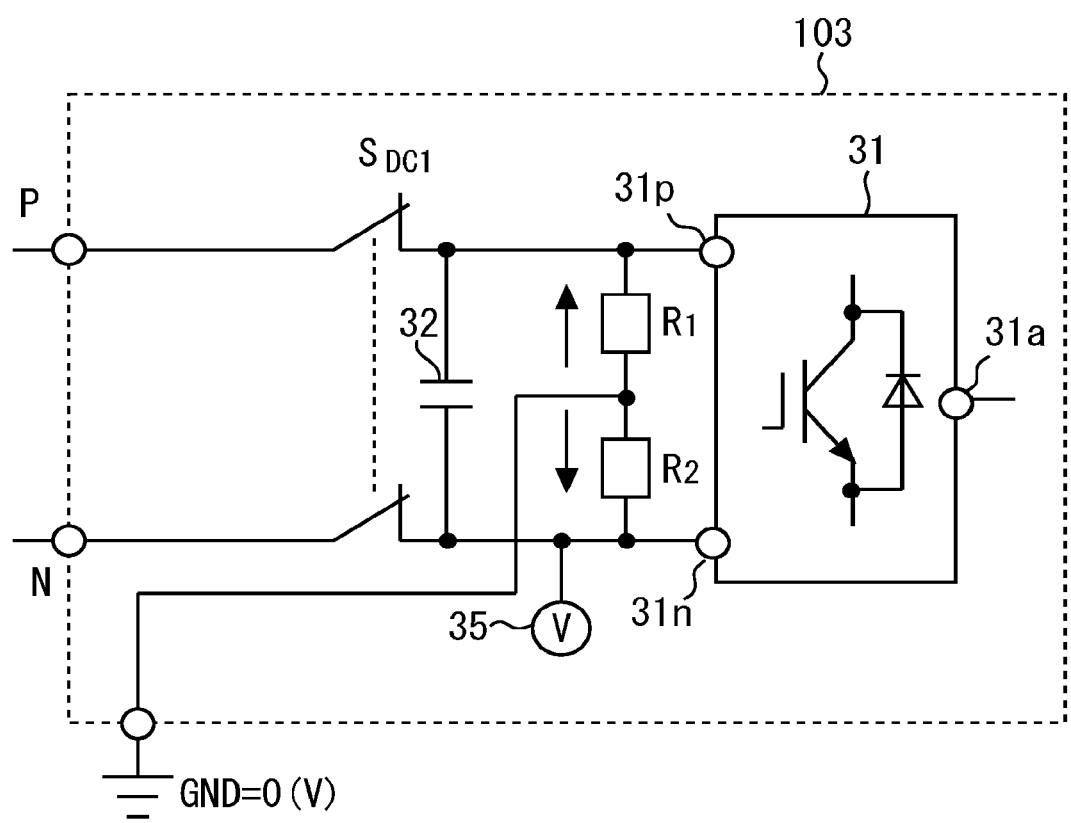
FIG. 15 is a diagram for explaining an internal configuration of the electric power conversion apparatus and the peripheral circuit thereof, according to the modified example of the embodiment.

| Number | Position of ground connection portion | Position of DC voltmeter | Corresponding figure | AC-side opening control | DC-side opening control |
|---|---|---|---|---|---|
| I | First position (side of DC power source) | Third position (side of DC power source) | FIG. 7 to FIG. 9 | Usable | Usable |
| II | First position (side of DC power source) | Fourth position (side of electric power conversion circuit) | FIG. 12 | Usable | Unusable |
| III | Second position (side of electric power conversion circuit) | Third position (side of DC power source) | FIG. 13 | Usable | Unusable |
| IV | Second position (side of electric power conversion circuit) | Fourth position (side of electric power conversion circuit) | FIG. 1 to FIG. 5, FIG. 14, and FIG. 15 | Usable | Unusable |

In all of the numbers I to IV, the AC-side opening control can be used. However, the DC-side opening control can be used only in the number I (combination of the first position and the third position).

A modified example of the ground connection portion will be described. In the embodiment, the ground resistor $R_G$ or the voltage dividing resistance circuits $R_1$ and $R_2$ incorporated in the electric power conversion apparatuses 3 and 103 are used as the ground connection portions. However, the configuration of the ground connection portion is not limited thereto.

As a modified example, in a case where the DC power source 2 includes a wind power generator (not shown) and an AC/DC converter (not shown) that converts the electric power generated by the wind power generator into DC power, the following modification is also possible. The AC/DC converter incorporates a ground resistor or a voltage dividing resistance circuit, in some cases, and an intermediate connection point between the voltage dividing resistance circuits $R_1$ and $R_2$ provided in the AC/DC converter is grounded, in some cases. Then, in the ground connection portion, any one of the ground resistor and the voltage dividing resistance circuit may be shared by the AC/DC converter and the electric power conversion apparatuses 3 and 103.

Figure 16:
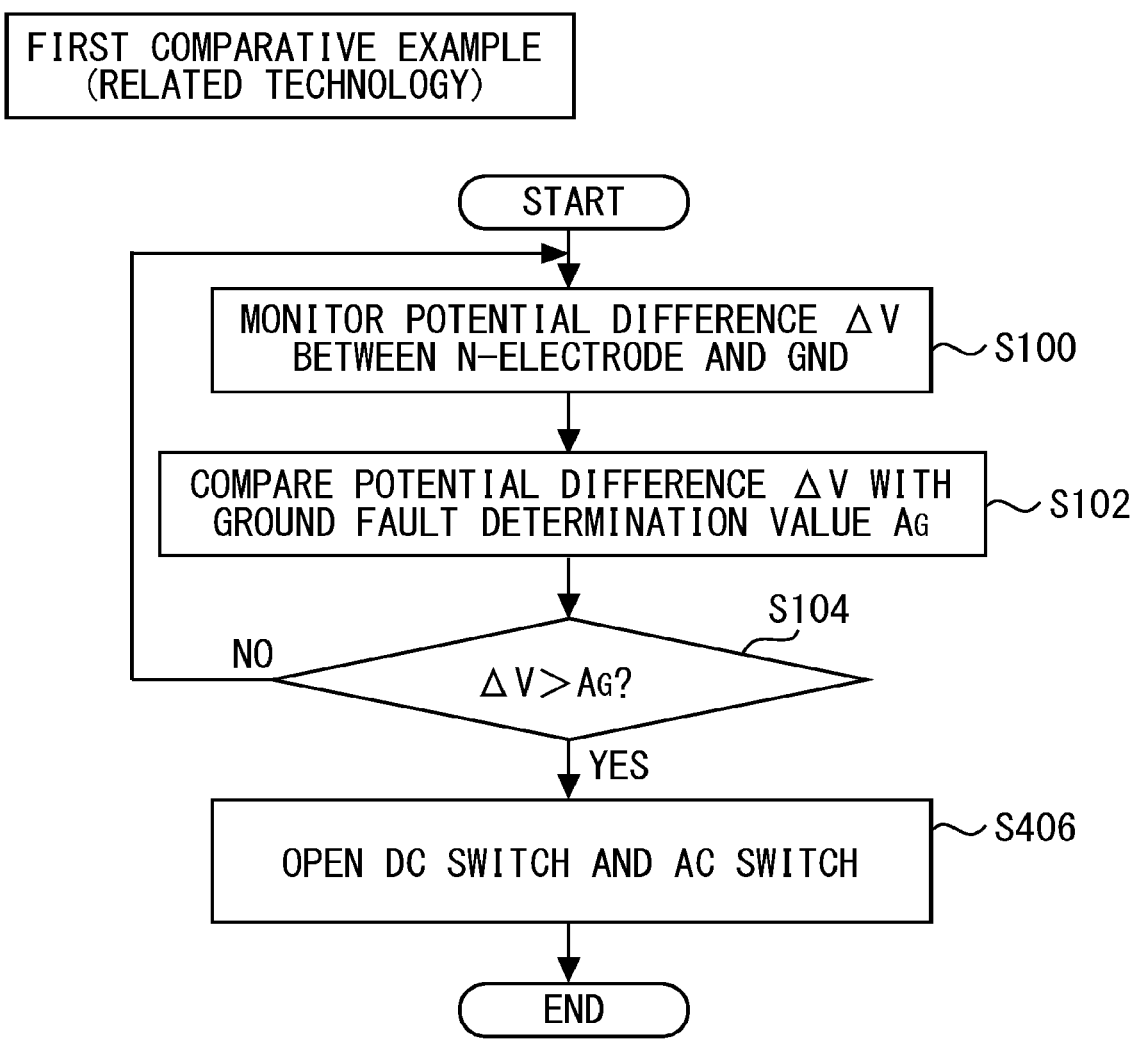
FIG. 16 is a flowchart for explaining control processing which is executed in an electric power conversion apparatus according to a first comparative example (related technology).
Figure 17:
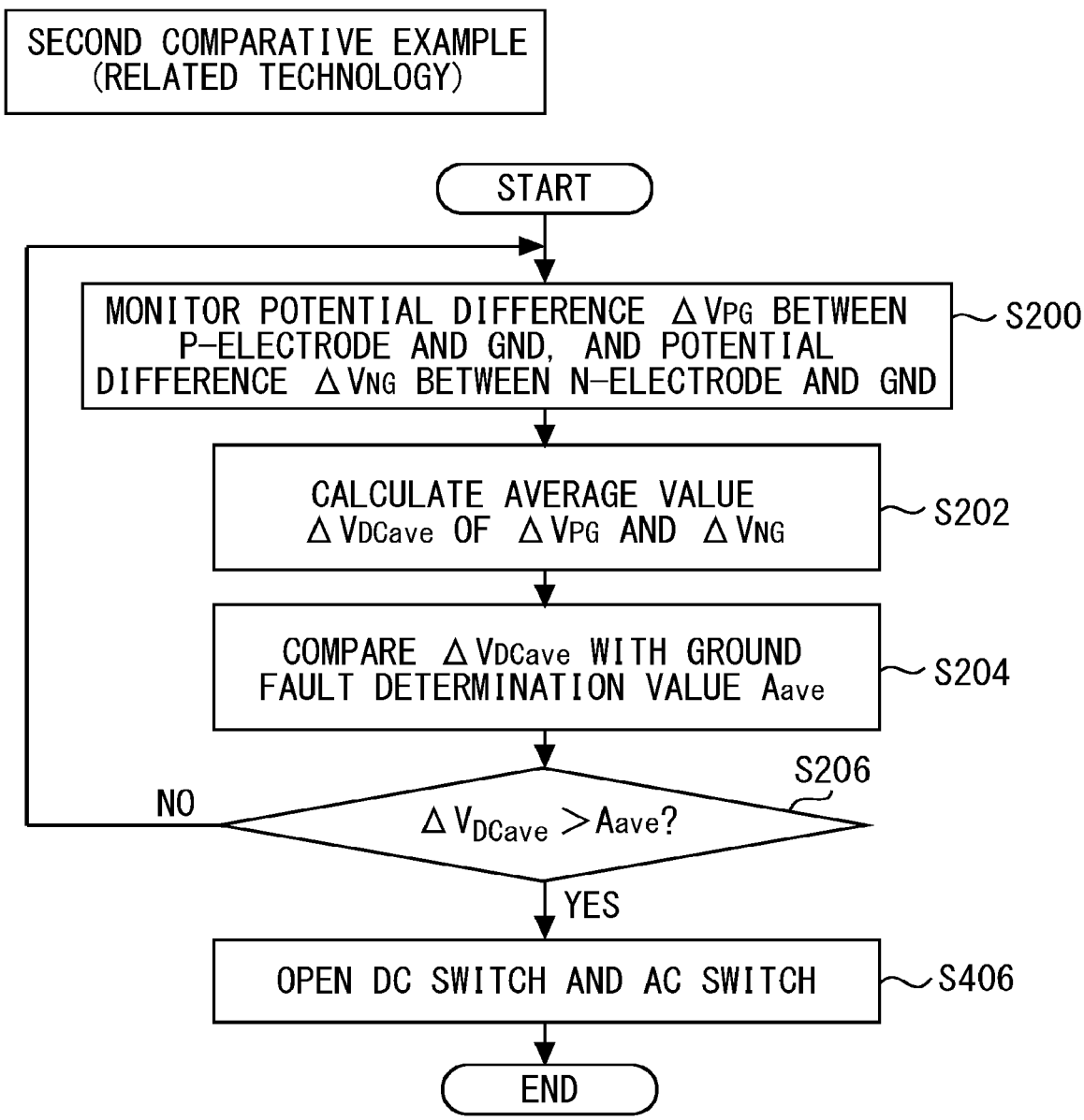
FIG. 17 is a flowchart for explaining control processing which is executed in an electric power conversion apparatus according to a second comparative example (related technology).

FIG. 16 is a flowchart for explaining the control processing which is executed in an electric power conversion apparatus according to a first comparative example (related technology). FIG. 17 is a flowchart for explaining the control processing which is executed in an electric power conversion apparatus according to a second comparative example (related technology). In FIG. 16 and FIG. 17, when the DC ground fault voltage is detected in steps S104 and S206, the DC switch and the AC switch are opened, in response to the detections, respectively (step S406). Thereby, the comparative examples have an advantage of being capable of quickly stopping the electric power conversion system, but cannot meet the need to continue the electric power conversion as continuously as possible.

In this regard, according to the embodiment, there is an advantage of being capable of identifying the location at which the DC ground fault has occurred, by performing the AC-side opening control or the DC-side opening control after the detection of the DC ground fault voltage, and restarting the operation by using the normal electric power conversion apparatus. For example, in a case where the DC power source 2 is a solar cell array, there is an advantage of being capable of improving a rate of operation in solar power generation, and/or maximizing an income by selling the electric power.

REFERENCE SIGNS LIST 1, 101 electric power conversion system
2 DC power source
3, 103 electric power conversion apparatus
4 interconnection transformer
4a parallel connection point
5 DC ground fault
5 positive electrode DC ground fault
5 negative electrode DC ground fault
9 public utility supply system
31 electric power conversion circuit
31a AC terminal
31p, 31n DC terminal
32 DC capacitor
33 AC reactor
34 control circuit
35 DC voltmeter
$A_G$ ground fault determination value
$A_{ave}$ average ground fault determination value
$R_G$ ground connection portion (ground resistor)
$R_1$, $R_2$ ground connection portion (voltage dividing resistance circuit).

The invention claimed is:

1. An electric power conversion apparatus comprising:
an electric power conversion circuit that includes a DC terminal and an AC terminal, allows the DC terminal to be connected to a DC power source via a DC bus line, and performs at least any one of converting DC power of the DC power source into AC power and outputting the AC power from the AC terminal, and converting AC power into DC power and outputting the DC power from the DC terminal;
a DC switch that is provided between the DC power source and the electric power conversion circuit, and is turned on when the electric power conversion circuit performs electric power conversion;
an AC switch that is provided on a side of the AC terminal, and is turned on when the electric power conversion circuit performs the electric power conversion;
a DC voltmeter that measures a potential at a predetermined portion which has been determined beforehand, on a side of the DC terminal;
a ground connection portion for connecting the DC bus line with a ground potential; and
a control circuit that is connected to the electric power conversion circuit, the DC switch, the AC switch and the DC voltmeter, wherein
the control circuit is structured so as to
detect whether or not a DC ground fault voltage has been generated on the basis of a measurement value of the DC voltmeter, while the electric power conversion circuit performs the electric power conversion;
when the DC ground fault voltage has been generated, execute AC-side opening control of opening the AC switch in a state in which the DC switch is turned on,
when the DC ground fault voltage has been restored in response to the AC-side opening control, determine that the DC ground fault is not occurring on a side of the DC terminal, and
when the DC ground fault voltage is not restored in response to the AC-side opening control, determine that the DC ground fault has occurred on the side of the DC terminal.

2. The electric power conversion apparatus according to claim 1, further comprising:
a positive electrode DC bus line and a negative electrode DC bus line that each connect the DC power source with the DC terminal, wherein
the ground connection portion comprises a ground resistor for connecting the negative electrode DC bus line with the ground potential.

3. The electric power conversion apparatus according to claim 1, further comprising:
a positive electrode DC bus line and a negative electrode DC bus line that each connect the DC power source with the DC terminal, wherein
the ground connection portion comprises a voltage dividing resistance circuit that contains a plurality of resistors connected in series,
one end of the voltage dividing resistance circuit is connected to the positive electrode DC bus line, the other end of the voltage dividing resistance circuit is connected to the negative electrode DC bus line, and
an intermediate connection point between the plurality of resistors included in the voltage dividing resistance circuit is connected to the ground potential.

4. An electric power conversion system comprising a plurality of the electric power conversion apparatuses according to claim 1, wherein
the AC terminals of the plurality of electric power conversion apparatuses are connected to each other at a parallel connection point without being connected via a transformer.

5. An electric power conversion apparatus comprising:
an electric power conversion circuit that includes a DC terminal and an AC terminal, allows the DC terminal to be connected to a DC power source via a DC bus line, converts DC power of the DC power source into AC power, and outputs the AC power from the AC terminal;
a DC switch that is provided between the DC power source and the electric power conversion circuit, and is turned on when the electric power conversion circuit performs electric power conversion;
a DC voltmeter that is provided on a side closer to the DC power source than the DC switch;
a ground connection portion for connecting the DC bus line with a ground potential on a side closer to the DC power source than the DC switch; and a control circuit that is connected to the electric power conversion circuit, the DC switch and the DC voltmeter, wherein the control circuit is structured so as to detect whether or not a DC ground fault voltage has been generated on the basis of a measurement value of the DC voltmeter, while the electric power conversion circuit performs the electric power conversion;

when the DC ground fault voltage has been generated, execute DC-side opening control of opening the DC switch, when the DC ground fault voltage has been restored in response to the DC-side opening control, determine that the DC ground fault is not occurring on a side closer to the DC power source than the DC switch, and when the DC ground fault voltage is not restored in response to the DC-side opening control, determine that the DC ground fault has occurred on a side closer to the DC power source than the DC switch.

6. The electric power conversion apparatus according to claim 5, wherein the DC power source comprises a converter that converts AC power into DC power, and in the ground connection portion, one of a ground resistor provided in the converter and a voltage dividing resistance circuit that is provided in the converter and of which an intermediate connection point is grounded is shared by the converter and the electric power conversion circuit.

7. An electric power conversion system comprising a plurality of the electric power conversion apparatuses according to claim 5, wherein the AC terminals of the plurality of electric power conversion apparatuses are connected to each other at a parallel connection point without being connected via a transformer.

* * * * *